US008879152B2

(12) United States Patent
Junger et al.

(10) Patent No.: US 8,879,152 B2
(45) Date of Patent: Nov. 4, 2014

(54) OPTICAL BANDPASS FILTER SYSTEM, IN PARTICULAR FOR MULTICHANNEL SPECTRAL-SELECTIVE MEASUREMENTS

(75) Inventors: Stephan Junger, Bubenreuth (DE); Wladimir Tschekalinskij, Nuremberg (DE); Norbert Weber, Weissenohe (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 145 days.

(21) Appl. No.: 13/809,949

(22) PCT Filed: Jul. 11, 2011

(86) PCT No.: PCT/EP2011/003468
§ 371 (c)(1),
(2), (4) Date: Jan. 30, 2013

(87) PCT Pub. No.: WO2012/007147
PCT Pub. Date: Jan. 19, 2012

(65) Prior Publication Data
US 2013/0120843 A1 May 16, 2013

(30) Foreign Application Priority Data

Jul. 15, 2010 (DE) .......................... 10 2010 027 252

(51) Int. Cl.
*G02B 5/28* (2006.01)
*G02B 5/20* (2006.01)
*G02B 1/00* (2006.01)
*B82Y 20/00* (2011.01)
*G02B 5/00* (2006.01)
*H01L 31/0216* (2014.01)
*H01L 27/146* (2006.01)

(52) U.S. Cl.
CPC *G02B 5/20* (2013.01); *G02B 1/005* (2013.01); *B82Y 20/00* (2013.01); *G02B 5/008* (2013.01); *H01L 27/14621* (2013.01); *G02B 5/204* (2013.01); *H01L 31/02162* (2013.01)
USPC ......................................................... 359/590

(58) Field of Classification Search
CPC ....................................................... G02B 5/204
USPC ......................................... 359/250, 589, 590
See application file for complete search history.

(56) References Cited

U.S. PATENT DOCUMENTS

| 6,040,936 | A | 3/2000 | Kim et al. ...................... 359/245 |
|---|---|---|---|
| 6,285,020 | B1 | 9/2001 | Kim et al. ...................... 250/216 |
| 7,386,204 | B1 | 6/2008 | Davis et al. ...................... 385/37 |
| 2002/0009251 | A1 | 1/2002 | Byrne ................................ 385/2 |
| 2003/0103150 | A1 | 6/2003 | Catrysse et al. ............... 348/272 |
| 2007/0165295 | A1 | 7/2007 | Kim et al. ...................... 359/245 |

(Continued)

OTHER PUBLICATIONS

International Search Report in corresponding PCT application No. PCT/EP2011/003468 mailed Oct. 17, 2011.

(Continued)

*Primary Examiner* — Joseph P Martinez
(74) *Attorney, Agent, or Firm* — Renner Kenner Greive Bobak Taylor & Weber

(57) ABSTRACT

The present invention relates to an optical bandpass filter system that has at least one combination of a bandpass filter that provides a first nanostructured metallic layer (4) and a bandstop filter comprising a second nanostructured metallic layer (7), which are arranged one behind the other, and the layer thicknesses of which are different. The bandstop filter is tuned to the bandpass filter in such a way that it blocks a contiguous wavelength range that partially overlaps a passband width of the bandpass filter. With the suggested optical filter system it is possible to create various filter characteristics side by side in a small space with a small pass-band width.

5 Claims, 3 Drawing Sheets

(56) References Cited

U.S. PATENT DOCUMENTS

2009/0323060 A1    12/2009   Knipp ............................ 356/327
2010/0046077 A1     2/2010   Lee et al. ....................... 359/585
2010/0220377 A1*    9/2010   Yamada et al. ............... 359/241

OTHER PUBLICATIONS

International Preliminary Report on Patentability in corresponding PCT application No. PCT/EP2011/003468 mailed Oct. 1, 2012.

*A Review of Metal Mesh Filters;* Ade et al.; SPIE; vol. 6275, 2006.
*Extraordinary Optical Transmission Through Sub-Wavelength Hole Arrays;* Ebbesen, et al.; Nature, Nature Publishing Group, London; Feb. 12, 1998.
*MEEP: A Flexible Free Software Package for Electromagnetic Simulations by the FDTD Method;* Oskooi et al.; Computer Physics Communications 181, pp. 687-702; 2010.

* cited by examiner

OPTICAL BANDPASS FILTER SYSTEM, IN PARTICULAR FOR MULTICHANNEL SPECTRAL-SELECTIVE MEASUREMENTS

TECHNICAL FIELD

The present invention relates to an optical bandpass filter system that has at least one bandpass filter with spectrally selective passing properties.

Optical filter systems are needed above all in the area of optical sensor systems, for example for spectroscopic measurement tasks or for spectrally selective optical detection. The increasing trend to towards miniaturisation of optical sensors demands filter systems with small lateral dimensions, for example for optical imaging sensors or chip-size spectrometers. At the same time, the filter systems used need to have a small spectral bandwidth in order to capture more than three colour channels or for narrow-band spectroscopic measurements. In addition, filter systems that can be integrated easily in the CMOS process in conjunction with CMOS components are also desirable.

RELATED ART

Conventional optical bandpass filters with a small spectral bandwidth are created by using dielectric thin-film filter systems as interference filters. These are made up of typically over 50 layers, which are applied one after the other, by vapour deposition for example. The wavelength of the filter can only be varied by varying the layer thicknesses, which makes it very difficult to construct an arrangement of different filters side by side within a very small space.

Optical bandpass filters that are created in thin metal layers with the aid of optical nanostructures, particularly from arrays of sub-wavelength apertures, also known as hole arrays in the present patent application, are also known. The basis for these "EOT filters" (Extraordinary Optical Transmission) is the publication by T. W. Ebbesen et al., "Extraordinary optical transmission through sub-wavelength hole arrays", Nature 391, 667 (1998). An adjacent arrangement of various filters can be created very easily in this context, because the filter wavelength can be varied simply via the lateral construction of the nanostructures in the metal layer, particularly via the diameter and the distance between the apertures with otherwise constant layer thickness. A filter arrangement of such kind is advantageous for production in the context of semiconductor processes, a CMOS process for example, since in such processes it is essential to use layers with constant thickness. In this way, for example, it is possible for the photodiodes of a photodiode array to be provided with different filters without the need for post-processing, particularly subsequent application and structuring of an extra layer. By combining a photodiode array with a filter array of laterally differing optical nanostructures in a metallic layer having constant layer thickness, it is possible to combine different spectral channels on one chip, both for individual colour sensors and for the pixels of an image sensor.

However, optical bandpass filters of metallic nanostructures have a comparatively large spectral bandwidth, typically of 100 nm. The filter effect associated therewith can be used for simple colour analysis with three colour channels, for example, but it is not adequate for more precise spectral or quasi-spectral measurements with more than three channels or for spectroscopic measuring tasks. Consequently, until now it has not been possible to produce multispectral sensors with significantly more than three channels and a chip-spectrometer using filters of such kind. Even sensor-related measuring tasks in which a small number (one to three) channels are sufficient but must be captured in a narrow band have not previously been practicable using these filters. Bandpass filters made from metallic nanostructures and having a narrower bandpass are as yet unknown.

The object of the present invention is to suggest an optical bandpass filter system that enables a laterally adjacent arrangement of differing filters having a small spectral bandwidth in a very small space, and the manufacture of which may easily be integrated in a semiconductor process, particularly a CMOS process.

BRIEF DESCRIPTION OF THE DRAWINGS

The proposed optical filter system will be explained again in the following with reference to embodiments thereof and in conjunction with the drawings. In the drawings.

DESCRIPTION OF THE INVENTION

Figure 1:
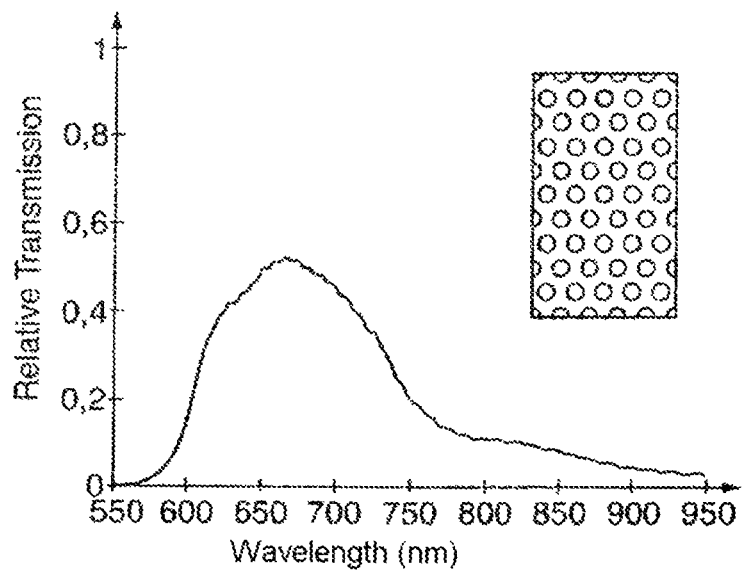
FIG. 1 shows an example of the pass-band range of an EOT bandpass filter.

This object is solved with the optical filter system according to patent claim 1. Advantageous variations of the optical filter system are the objects of the dependent claims or may be concluded from the following description and embodiments.

The suggested optical filter system includes at least one combination of a bandpass filter and a bandstop filter which are arranged one on top of the other to achieve a combination filter effect. The bandpass filter is made from a first nanostructured metallic layer having a first layer thickness and the bandstop filter is made from a second nanostructured metallic layer having a second layer thickness, wherein the first layer thickness is selected to be different from the second layer thickness. In this context, the bandstop filter is tuned to the bandpass filter in such manner that it blocks a contiguous wavelength range that partially overlaps a pass-band width of the bandpass filter. Accordingly, one of the flanks of the pass-band range of the bandpass filter is cut off by the bandstop filter, so that the optical filter system has a narrower pass-bandwidth or spectral bandwidth than the bandpass filter. The differing selection of layer thicknesses enables improved filtering characteristics with high filter transmission at the centre wavelength of the filter system.

The first layer thickness is preferably selected in the range between 130 nm and 270 nm, particularly preferably between 150 nm and 250 nm, and the second layer thickness in the range between 30 nm and 170 nm, particularly preferably between 50 nm and 150 nm. With these values, particularly advantageous filter characteristics are obtained, particularly with regard to a combination of a narrow bandwidth with steep flanks and high transmission at the centre wavelength.

In this context, the bandpass filter is preferably constructed as a nanostructured metallic layer in the form of a hole array, that is to say in the form of an EOT filter. The relatively wide pass-bandwidth of this filter is reduced considerably when it is used in combination with the bandstop filter in the overall system. Such a bandpass filter comprises an array of nanoapertures in a thin metal layer, as is known from the related art. The nanoapertures in this case may be circular or have other geometrical shapes. The centre wavelength of the passband range (relative to the full width half maximum of the passband range), referred to in the following as the filter wavelength, is determined primarily by the period or the distance between the apertures and to a lesser degree by the diameter of the apertures. The aperture diameter is mainly responsible for determining the filter bandwidth, which means that both the wavelength and the bandwidth of the filter may be adjusted within certain limits by appropriate selection of these two parameters. A particular advantage of such a filter based on a nanostructured metallic layer consists in that it thus becomes easy to produce filters with differing filtering characteristics, particularly different filter wavelengths, next to each other and within a very small space on a substrate. In this context, it is only necessary to provide a metallic layer with uniform layer thickness, which is then nanostructured accordingly. The disadvantage of the relatively large bandwidth of such a filter is avoided in the present optical filter system by combining it with the bandstop filter.

A bandpass filter of such design is preferably combined with a bandstop filter constructed from a metallic layer of uniform or constant thickness, that is also nanostructured to form a structure that complements hole arrays, particularly a periodic arrangement of metallic cuboids or cylinders that in the present patent application is also referred to as an island array. Such a structure has the characteristics of a bandstop filter, whose blocking range (position and width) may be adjusted by suitable selection of the period or distance and the size of the cubes or cylinders. Such a combination of bandpass filter and bandstop filter may be created highly advantageously with processes used in semiconductor technology, particularly in a CMOS process, since each filter only requires one metallic layer of uniform thickness, and which is structured according to the desired filtering characteristics. In this way, differing filtering characteristics may be generated side by side in an extremely small space via different structuring for the bandstop filter as well. The two filters are advantageously separated by a CMOS-compatible layer made from a material that is transparent for the desired pass-bandwidth, from $SiO_2$ for example. Of course, the metallic layers are also made from materials selected to be CMOS-compatible, aluminium for example.

The essential feature of the proposed filter system is that the bandstop filter limits the pass-bandwidth of the bandpass filter from one wavelength side, that is to say starting from the short wavelength side or the long wavelength side, in the overall system. In this way, a smaller pass-bandwidth of the filter system is achieved. Since all filters can be created in the form of a structured layer having constant thickness (in the condition before structuring), the proposed filter system may easily be integrated in a semiconductor process for manufacturing optical sensors. The narrow pass-bandwidth that is achievable through the combined effect of the two filters and the capability for the filter wavelength to be varied easily during the manufacturing process enables filters or filter combinations with pass-band characteristics of different narrowness to be arranged laterally in the smallest possible space.

In a preferred variation of the suggested filter system, therefore, a plurality of the combinations of bandpass filter and bandstop filter are also arranged side by side on a substrate or carrier, wherein at least some of the combinations have differing wavelength pass-band ranges, particularly mutually offset centre wavelengths. In this way, optical sensors with multiple narrow band colour channels may be created in a very small space.

Narrow-band optical bandpass filter systems are of great importance in sensor technology and spectroscopy. An arrangement of, for example, 10 or more such filter systems on an array of CMOS photodiodes enables the production of a chip-size spectrometer. If the suggested filter system is used for imaging sensors, it is possible to make multispectral cameras, for 16 wavelengths for example, without any mechanically moving parts such as filter wheels. Even in cases where few channels are used, the application, analytics for example, often requires narrow-band optical bandpass filters such as are provided with the suggested filter system. The optical filter system is usable for example for locally resolved spectral acquisition in applications in the field of monitoring and control of LEDs for many lighting situations, such as buildings and LCD backlights, monitoring and controlling inks in the printing process, for miniaturised multispectral sensors/mini-spectrometers for the analysis of gases, liquids or fabrics and in multispectral cameras.

The filters made from nanostructured metallic layers that are used in the suggested filter system may be dimensioned appropriately for example using commercially available software such as OptiFDTD manufactured by the Optiwave Corporation or with freely available software such as the software described by A. F. Oskooi et al. in "MEEP: A flexible free software package for electromagnetic simulations by the FDTD method", Computer Physics Communications 181, 687-702 (2010). The diameters that are needed to produce the desired filtering effect and bandstop effect as well as the distances between apertures or raised areas such as cubes or cylinders may be determined using such a program. Structuring in the metallic layer is then carried out in known manner by photolithography and subsequent etching technology.

Ways to Implement the Invention

FIG. 1 shows the simulation of the wavelength-dependent transmission of an optical bandpass filter formed by a metallic layer having an array of nanoapertures (hole array). The bandpass filter has a transmission of about 50% at 670 nm and a full width half maximum (FWHM) of approximately 113 nm. Despite previously performed optimisation, the filter bandwidth of such a filter cannot be reduced further. The associated wavelength range in this embodiment is from 350 to 1100 nm, the thickness of the metal layer of such a filter in the suggested filter system is in the range between 130 nm and 270 nm. Typical hole diameters are from 100 to 300 nm, the period of the hole pattern from 200 to 600 nm. A schematic top view of the structure of this filter is indicated in the top right-hand portion of the diagram.

Figure 2:
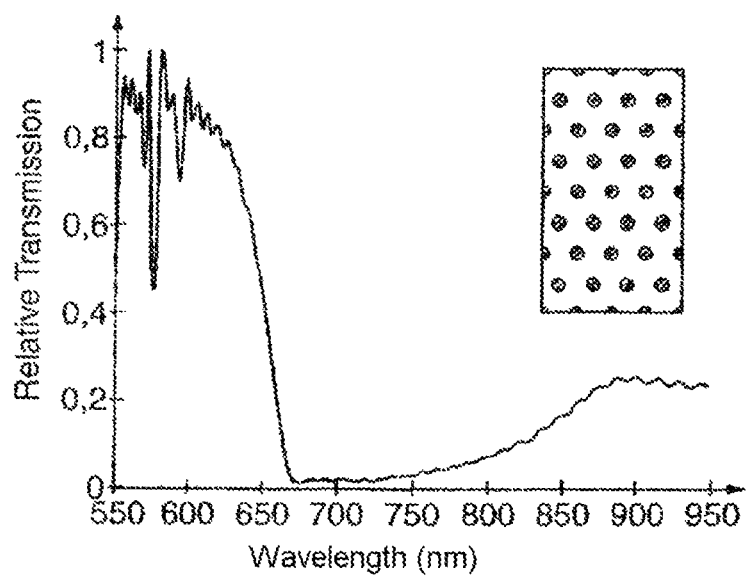
FIG. 2 shows an example of wavelength-dependent transmission of an optical bandstop filter based on nanostructured metallic layer.

FIG. 2 shows the simulation of an optical bandstop filter formed by a metallic layer formed by a periodic arrangement of metallic cylinders (island array) in a metallic layer. Above a wavelength of about 630 nm, the spectral curve exhibits bandstop filter characteristics. In this case too, a top view of the structure of this filter is indicated in the top right-hand portion of the figure. In a filter of this kind, the cylinders have typical diameters from 100 to 300 nm, and in the suggested filter system a height from 30 to 170 nm.

Figure 3:
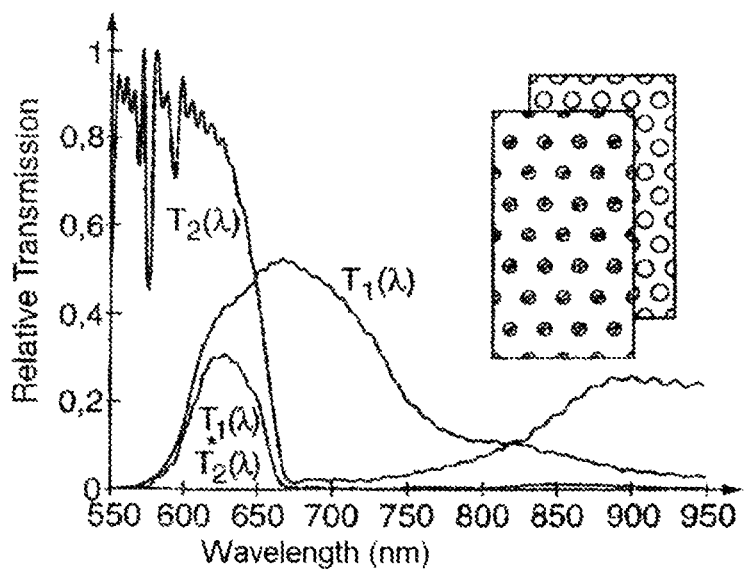
FIG. 3 shows an example of the pass-band range of the suggested optical filter system.

The basic idea of the optical filter system suggested here consists in reducing the spectral bandwidth of a bandpass filter having a relatively large spectral bandwidth, as is illustrated in FIG. 1, by combining it with a bandstop filter slightly offset with regard to the centre wavelength, as is illustrated in FIG. 2, wherein it is possible to achieve high transmission for the resulting centre wavelength of the filter system by variously selecting the layer thicknesses of the two filter layers. The combination of these two filter types is represented in FIG. 3. $T_1(\lambda)$ shows the transmission curve of the wide bandpass filter of FIG. 1. $T_2(\lambda)$ shows the transmission curve of the bandstop filter of FIG. 2. The resulting production function $T_1(\lambda) \times T_2(\lambda)$ corresponds to the transmission curve or wavelength pass-band range of the suggested filter system.

If the distance between the bandpass and the bandstop filters is greater than the extent of the respective evanescent fields, for example greater than 200 nm, the field distributions of the two filter structures are not coupled, and the resulting filter characteristics closely approximate the illustrated product function $T_1(\lambda) \times T_2(\lambda)$. A small distance between the two filter layers is necessary for technological reasons anyway. However, even a small distance with field coupling of the two nanostructures results in similar field characteristics, the precise behaviour of which may also be optimised by simulation of the two-layer arrangement. The distance indicated in the preceding is therefore not absolutely necessary to ensure the function of the suggested optical filter system.

Figure 4:
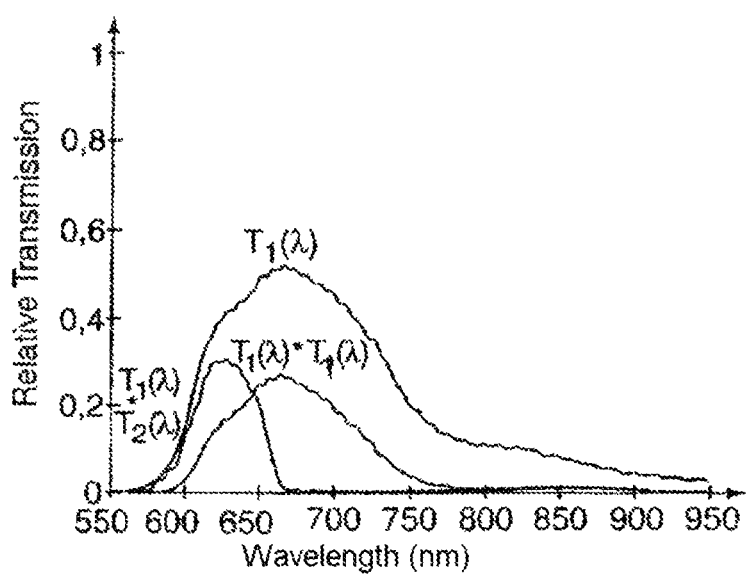
FIG. 4 shows a comparison between the pass-band range of the suggested optical filter system and the pass-band range of an EOT bandpass filter according to FIG. 1 and the pass-band range of a combination of two identical EOT bandpass filters.

FIG. 3 shows that the optical filter system obtained by combining the two filters has a significantly smaller full width half maximum than that of the bandpass filter of FIG. 1. For this purpose, FIG. 4 shows a comparison between the wavelength-dependent transmission $T_1(\lambda)$ of FIG. 1, the wavelength-dependent transmission in cascade of two identical bandpass filters $T_1(\lambda) \times T_1(\lambda)$, and the wavelength-dependent transmission of the suggested filter system of FIG. 3. With a value of 47 nm, the full width half maximum (FWHM) is reduced considerably compared with the bandpass filter of FIG. 1 with 113 nm, and by a factor of 2 compared with the cascaded, two-stage bandpass filter arrangement with an FWHM of 93 nm. At 30%, maximum transmission is also slightly higher than for the cascaded arrangement, with 25%.

Figure 5:
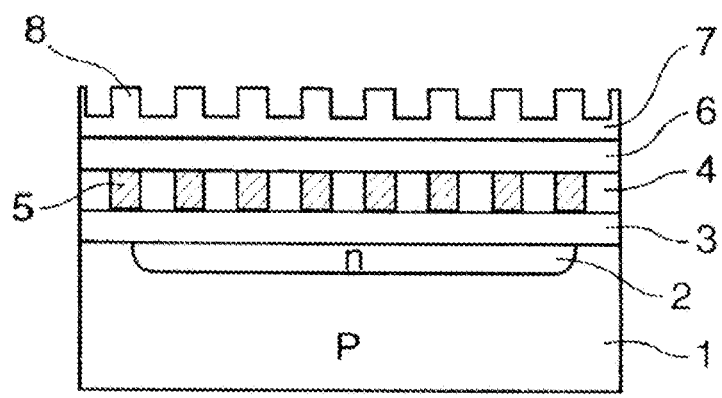
FIG. 5 shows an exemplary construction of the suggested filter system from an EOT bandpass filter and a bandstop filter, each being made from a nanostructured metallic layer.

FIG. 5 shows a highly schematic example of a structure of the suggested filter system on top of a photodiode. The figure shows only a section of one arrangement in which multiple photodiodes are constructed side by side in a substrate, and on which the corresponding filter system is then constructed. In such case, the optical filter system has a plurality of filters or filter combinations arranged side by side, wherein one filter combination in each case is located above a photodiode. Differing filtering characteristics are preferably lent to a plurality of the filter combinations by realising different structures for the filters. The respective photodiode in this example is formed by an n-doped well 2 in a p-doped semiconductor substrate 1. Dielectric intermediate layer 3 and a metallic layer 4 are deposited over the top thereof, nanoapertures 5 being created in with the corresponding desired filtering characteristics in the metallic layer. An additional dielectric intermediate layer 6 is then deposited on this bandpass filter, which is formed by first structured metallic layer 4, and a second metallic layer 7 is then deposited on top of this. Second metallic layer 7 has a smaller layer thickness than first metallic layer 4, which forms the bandpass filter, and is structured to create the desired bandstop filter, wherein cylindrical or cuboid structures 8 are generated with the desired lateral dimensions and distances depending on the intended filtering characteristics. The electrical intermediate layers 3, 6 may be silicon dioxide ($SiO_2$) layers, for example. The electrical contacts of the p- and n-fields of the photodiode are not shown in the figure. They are usually formed by suitable through-connections through the individual layers. Of course, additional CMOS process layers, such as are required for the respective function of the component, may also be located below first metallic layer 4, above second metallic layer 7, and between these two metallic layers.

LIST OF REFERENCE SIGNS 1 p-doped semiconductor substrate
2 n-doped well
3 dielectric intermediate layer
4 first metallic layer for bandpass filter
5 nanoapertures
6 dielectric intermediate layer
7 second metallic layer for bandstop filter
8 cylindrical or cuboid nanostructures

The invention claimed is:

1. An optical filter system that has at least one combination of a bandpass filter comprising a first nanostructured metallic layer having a first layer thickness, and a bandstop filter comprising a second nanostructured metallic layer having a second layer thickness, which are arranged one on top of the other, wherein the first nanostructured metallic layer forms a hole array and the second nanostructured metallic layer forms an island array, the bandstop filter is tuned to the bandpass filter in such a way that it blocks a contiguous wavelength range that partially overlaps a pass-band width of the bandpass filter, and wherein the first and second layer thicknesses differ from one another, the first layer thickness being selected between 150 nm and 250 nm and the second layer thickness being selected between 50 nm and 150 nm.

2. The optical filter system according to claim 1, characterised in that a plurality of the combinations of the bandpass filter and the bandstop filter are arranged one beside the other.

3. The optical filter system according to claim 2, characterized in that at least some of the combinations have differing wavelength pass-band ranges.

4. The optical filter system according to claim 1 or 3, characterized in that the individual filters have lateral dimensions of ≤5 mm.

5. An optical sensor or spectrometer having a filter system according to claim 1 for wavelength-selective detection.

* * * * *